(12) United States Patent
Ye et al.

(10) Patent No.: US 7,492,592 B2
(45) Date of Patent: Feb. 17, 2009

(54) HEAT DISSIPATING APPARATUS FOR EQUIPMENT CHASSIS

(75) Inventors: Zhen-Xing Ye, Shenzhen (CN); Xiao-Zhu Chen, Shenzhen (CN)

(73) Assignees: Hong Fu Jin Precision Industry (ShenZhen) Co., Ltd., Shenzhen, Guangdong Province (CN); Hon Hai Precision Industry Co., Ltd., Tu-Cheng, Taipei Hsien (TW)

( * ) Notice: Subject to any disclaimer, the term of this patent is extended or adjusted under 35 U.S.C. 154(b) by 9 days.

(21) Appl. No.: 11/852,338

(22) Filed: Sep. 10, 2007

(65) Prior Publication Data
US 2008/0204997 A1    Aug. 28, 2008

(30) Foreign Application Priority Data
Feb. 27, 2007   (CN) .................... 2007 1 0200237

(51) Int. Cl.
*H05K 7/20*  (2006.01)
*F01D 25/28* (2006.01)

(52) U.S. Cl. .................... 361/695; 361/690; 415/213.1; 174/16.1
(58) Field of Classification Search ............... None
See application file for complete search history.

(56) References Cited

U.S. PATENT DOCUMENTS

| | | | | |
|---|---|---|---|---|
| 6,340,283 | B1 * | 1/2002 | Hedger et al. | 415/60 |
| 7,408,774 | B1 * | 8/2008 | Anderl et al. | 361/695 |
| 2003/0175123 | A1 * | 9/2003 | Yeh | 416/246 |
| 2007/0047200 | A1 * | 3/2007 | Huang | 361/695 |

* cited by examiner

*Primary Examiner*—Boris L Chervinsky
(74) *Attorney, Agent, or Firm*—Frank R. Niranjan

(57) ABSTRACT

A heat dissipating apparatus includes a bracket mounted in an equipment chassis, a fixing plate, a fan installed on the fixing plate, a rotating device mounted in the bracket and rotatably connecting with the fixing plate, and a circuit board fixed in the bracket. The circuit board includes a control circuit for controlling the rotating device to rotate the fixing plate to thereby change orientation of the fan.

19 Claims, 4 Drawing Sheets

HEAT DISSIPATING APPARATUS FOR EQUIPMENT CHASSIS

BACKGROUND

1. Field of the Invention

The present invention relates to heat dissipating apparatuses, and more particularly to a heat dissipating apparatus for an equipment chassis.

2. Description of Related Art

An equipment chassis, such as a computer chassis, usually includes a fan for dissipating heat produced by electronic components installed in the chassis. However, the fan is immovably fixed in the chassis, so only part of the space in the chassis receives airflow directly from the fan, leaving many electronic components out of the direct line of airflow, which is inefficient.

What is needed, therefore, is an apparatus which is able to efficiently cool an equipment chassis.

SUMMARY

An exemplary heat dissipating apparatus includes a bracket mounted in an equipment chassis, a fixing plate, a fan installed on the fixing plate, a rotating device mounted in the bracket and rotatably connecting with the fixing plate, and a circuit board fixed in the bracket. The circuit board includes a control circuit for controlling the rotating device to rotate the fixing plate to thereby change orientation of the fan.

Other advantages and novel features will become more apparent from the following detailed description of embodiments when taken in conjunction with the accompanying drawings, in which:

DETAILED DESCRIPTION

Figure 1:
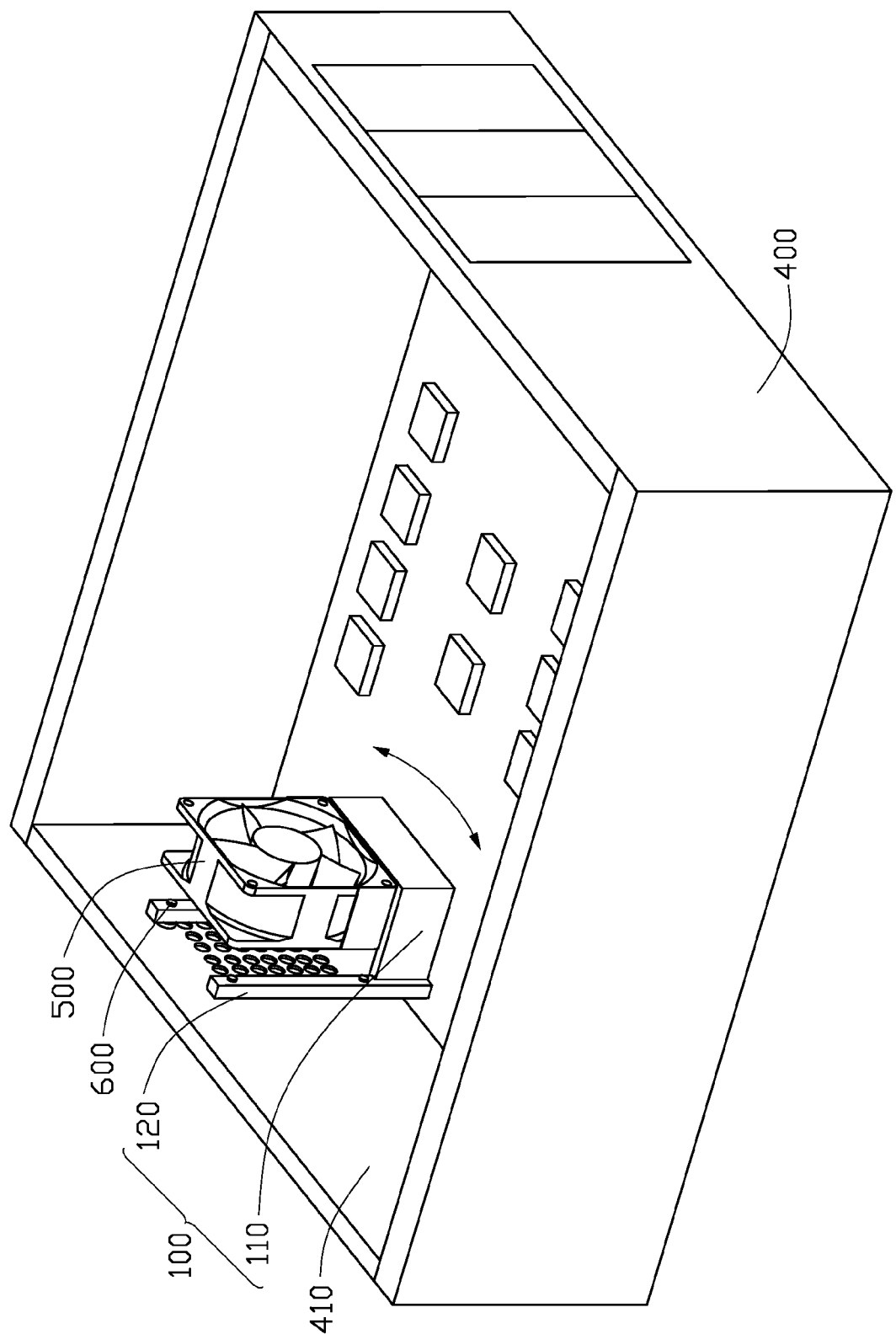
FIG. 1 is an assembled, isometric view of a heat dissipating apparatus in an equipment chassis in accordance with an embodiment of the present invention, the heat dissipating apparatus includes a mounting device.
Figure 2:
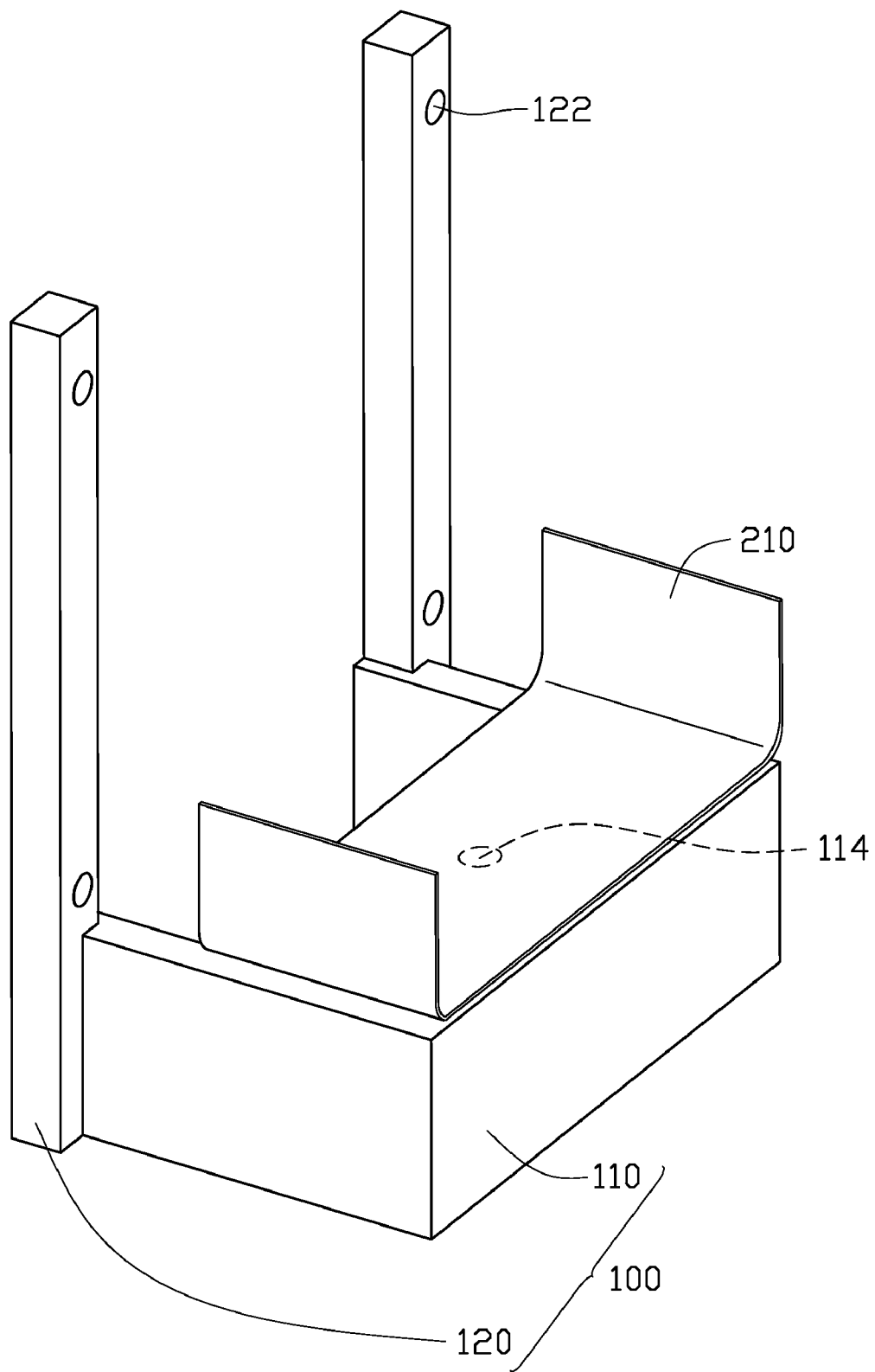
FIG. 2 is an isometric view of the mounting device of FIG. 1.
Figure 3:
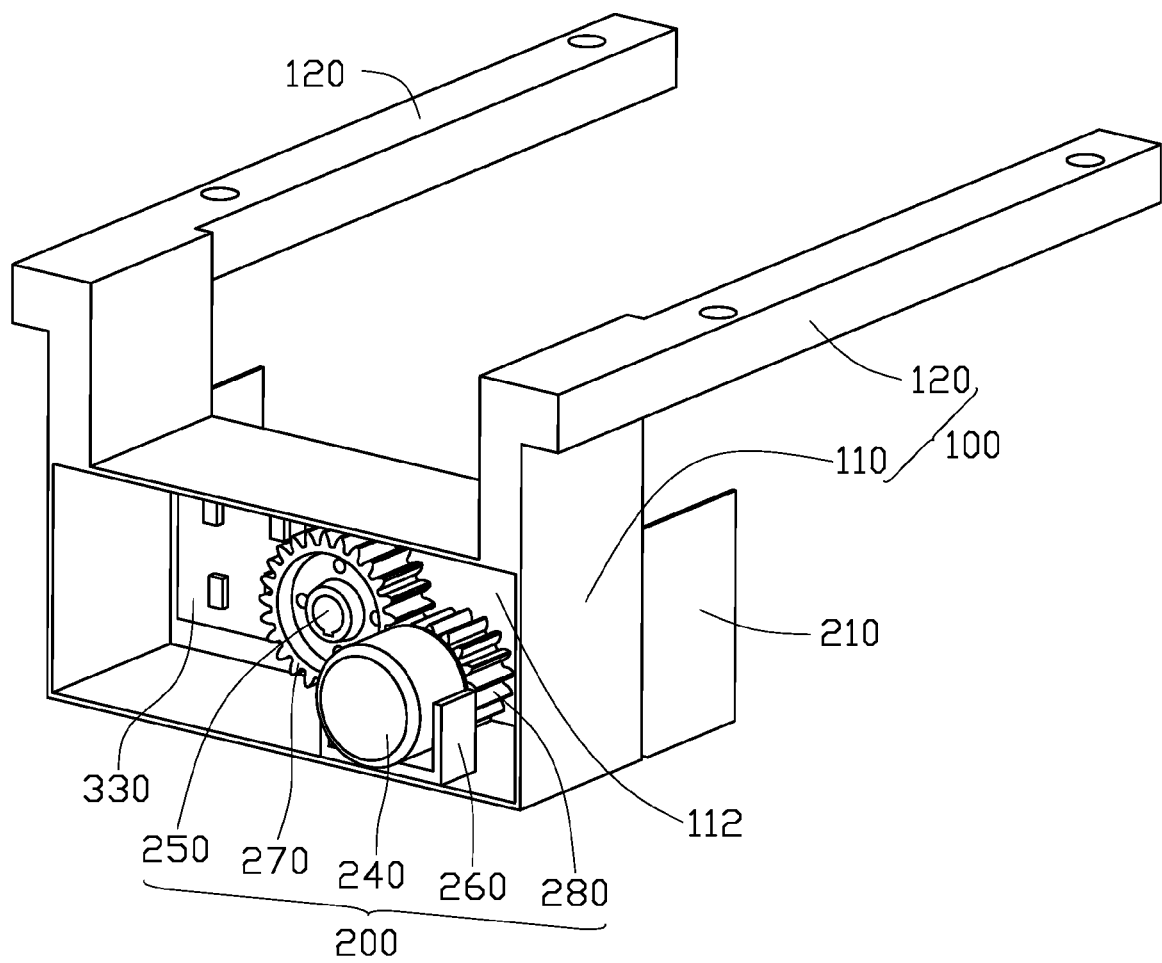
FIG. 3 is an isometric view of the heat dissipating apparatus of FIG. 1.

Referring to FIGS. 1 to 3, a heat dissipating apparatus is provided in accordance with a first embodiment of the present invention. The heat dissipating apparatus is mounted in an equipment chassis 400 having a plurality of electronic components therein, and includes a mounting device, and a fan 500. The mounting device includes a bracket 100, a rotating device 200, and a fixing plate 210. In this embodiment, the equipment chassis 400 is a computer chassis.

The bracket 100 includes a box-shaped base 110 having a top wall 112, and four sidewalls. Two generally L-shaped arms 120 extend out then up from two end portions of one of the sidewalls of the base 110. Each arm 120 defines two fixing holes 122 in a portion above the top wall 112 of the base. A fixing portion 260 is formed on an inside surface of another one of the sidewalls of the base 110. A through hole 114 is defined in the top wall 112. A circuit board 330 is mounted in the base 110.

The fixing plate 210 is generally U-shaped and used for clamping the fan 500 therein. The fixing plate 210 includes a bottom wall and two elastic arms extending perpendicularly from the bottom wall.

The rotating device 200 is mounted in the base 110 of the bracket 100. The rotating device 200 includes an electromotor 240 having a shaft (not shown) fixed to the fixing portion 260 of the base 110 and electrically connected with the circuit board 330 of the base 110, a first gear 280 fixed to the shaft of the electromotor 240, a rotating shaft 250 passing through the through hole 114 of the base 110 to connect with the bottom wall of the fixing plate 210, and a second gear 270 fixed to the rotating shaft 250 in the base 110 and engaging with the first gear 280. The number of gear teeth of the second gear 270 is more than that of the first gear 280. Thereby, rotating speed of the second gear 270 and the rotating shaft 250 is slower than that of the first gear 280 and the electromotor 240.

Figure 4:
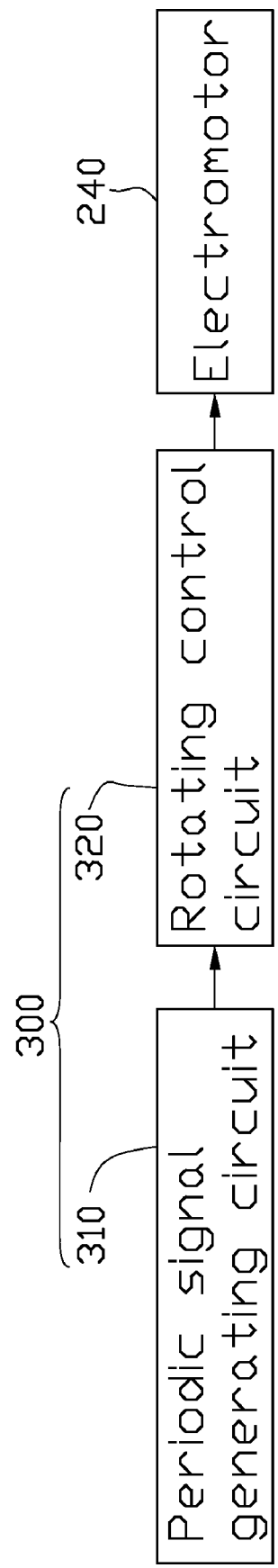
FIG. 4 is a working block diagram of the heat dissipating apparatus of FIG. 3.

Referring to FIG. 4, the circuit board 330 includes a control circuit 300. The control circuit 300 includes a periodic signal generating circuit 310 for generating a periodic square wave signal, and a rotating control circuit 320 for controlling rotation of the shaft in the electromotor 240 according to the signal. The shaft of the electromotor 240 rotates in one direction during the first half of one cycle of the signal, and then rotates in the opposite direction during the second half of the cycle.

Referring back to FIGS. 1 to 3, in assembly, a plurality of fasteners 600, such as screws are extended through the fixing holes 122 of the arms 120 of the bracket 100 respectively and screwed into a rear plate 410 of the equipment chassis 400. Thereby, the bracket 100, the fixing plate 210, and the rotating device 200 are mounted in the equipment chassis 400. The rear plate 410 defines a plurality of vents, and the fan 500 is aligned with the vents. The fan 500 is fixed to the fixing plate 210 with two lateral portions of the fan 500 being clamped by the elastic arms of the fixing plate 210. In this embodiment, the fan 500 is an axial fan, and the axis of the fan 500 is perpendicular to the rear plate 410.

In use, the periodic signal generating circuit 310 of the circuit board 330 generates a periodic square wave signal. The rotating control circuit 320 receives the signal, and controls the rotation of the shaft in the electromotor 240. The first gear 280 rotates together with the shaft in the electromotor 240, and drives the second gear 270 and the rotating shaft 250 to rotate in the first direction in the first half of one cycle of the signal. The fixing plate 210 and the fan 500 mounted thereon thus rotate together with the rotating shaft 250 to a desired angle in the first direction, and the desired angle is set by the rotating angle of the electromotor 240, and gear ratio of the first gear 280 and the second gear 270. The shaft of electromotor 240 rotates in the opposite direction in the second half of the cycle of the signal, and the fixing plate 210 and the fan 500 rotate in the opposite direction. Thereby, the fan 500 mounted in the equipment chassis 400 sweeps back and forth along an arc path of the arrowhead as shown in FIG. 1, directing airflow to nearly all space in the equipment chassis 400.

In another embodiment, the rotating shaft 250, the first gear 280, and the second gear 270 of the first embodiment are omitted. The shaft of the electromotor 240 passes through the through hole 114 of the base 110 to directly connect with the fixing plate 210. In use, the electromotor 240 drives the fixing plate 210 and the fan 500 to sweep back and forth.

It is believed that the present embodiments and their advantages will be understood from the foregoing description, and it will be apparent that various changes may be made thereto without departing from the spirit and scope of the invention or sacrificing all of its material advantages, the example hereinbefore described merely being preferred or exemplary embodiments of the invention.

What is claimed is:

1. A heat dissipating apparatus for an equipment chassis, the heat dissipating apparatus comprising:
   a bracket configured to be mounted in the equipment chassis;
   a fixing plate;
   a fan installed on the fixing plate;
   a rotating device mounted in the bracket comprising an electromotor, a first gear driven by the electromotor, a rotating shaft passing through the bracket and connecting with the fixing plate, and a second gear fixed to the rotating shaft and engaging with the first gear; and
   a circuit board fixed in the bracket comprising a control circuit for controlling the electromotor to rotate, such that the combined fixing plate and fan is capable of being driven to rotate relative to the bracket by the rotating device.

2. The heat dissipating apparatus as claimed in claim 1, wherein the bracket comprises a base, the rotating device is mounted in the base, the base comprises a top wall to support the fixing plate, a through hole is defined in the top wall to allow the rotating shaft to pass therethrough.

3. The heat dissipating apparatus as claimed in claim 2, wherein the bracket further comprises two spaced arms extending from the base, each of the arms defines at least one fixing hole, and at least two fasteners are extended through the corresponding fixing holes of the arms and screwed into a plate of the equipment chassis.

4. The heat dissipating apparatus as claimed in claim 3, wherein the base further comprises a sidewall perpendicular to the top wall, each of the arms is generally L-shaped, and the arms extend out then up from two end portions of the sidewall of the base.

5. The heat dissipating apparatus as claimed in claim 1, wherein the fixing plate comprises a bottom wall connecting with the rotating shaft for supporting the fan, and two elastic arms extending perpendicularly from the bottom wall for clamping the fan.

6. The heat dissipating apparatus as claimed in claim 1, wherein the control circuit comprises a periodic signal generating circuit for generating a periodic signal, and a rotating control circuit for receiving the periodic signal and controlling rotation of the electromotor.

7. A heat dissipating apparatus for an equipment chassis, the heat dissipating apparatus comprising:
   a bracket configured to be mounted in the equipment chassis;
   a fixing plate;
   a fan installed on the fixing plate;
   a rotating device mounted in the bracket and connecting with the fixing plate rotatably; and
   a circuit board fixed in the bracket comprising a control circuit for controlling the rotating device to rotate the combined fixing plate and fan.

8. The heat dissipating apparatus as claimed in claim 7, wherein rotating device comprises an electromotor, the electromotor comprises a rotatable shaft passing through the bracket and connected with the fixing plate, such that the fixing plate is capable of rotating together with the shaft of the electromotor.

9. The heat dissipating apparatus as claimed in claim 8, wherein the bracket comprises a base, the electromotor is mounted in the base, the base comprises a top wall, a through hole is defined in the top wall to allow the shaft of the electromotor to pass therethrough.

10. The heat dissipating apparatus as claimed in claim 9, wherein the bracket further comprises two spaced arms extending from the base, each of the arms defines at least one fixing hole, and at least two fasteners are extended through the corresponding fixing holes of the arms and screwed into a plate of the equipment chassis.

11. The heat dissipating apparatus as claimed in claim 10, wherein the base further comprises a sidewall perpendicular to the top wall, each of the arms is generally L-shaped, and the arms extend out then up from two end portions of the sidewall of the base.

12. The heat dissipating apparatus as claimed in claim 8, wherein the fixing plate comprises a bottom wall connecting with the shaft of the electromotor for supporting the fan, and two elastic arms extending perpendicularly from the bottom wall for clamping the fan.

13. The heat dissipating apparatus as claimed in claim 8, wherein the control circuit comprises a periodic signal generating circuit for generating a periodic signal, and a rotating control circuit for receiving the periodic signal and controlling rotation of the shaft of the electromotor, in one cycle of the periodic signal, the electromotor sweeps back and forth.

14. A combination comprising
   a chassis configured to accommodate electronic components therein;
   a mounting bracket fixed in the chassis;
   a fixing plate with a fan installed thereat;
   a rotating device mounted in the bracket, the rotating device comprising an electromotor having a rotatable shaft passing through the bracket to fix with the fixing plate; and
   a control circuit for periodically controlling the electromotor to rotate in two opposite directions such that the combined fixing plate and fan periodically rotate relative to the chassis in two opposite directions.

15. The combination as claimed in claim 14, wherein the rotating device comprises a first gear driven by the electromotor, and a second gear fixed to the rotating shaft and meshed with the first gear, rotation speed of the second gear being smaller than that of the first gear.

16. The combination as claimed in claim 14, wherein the chassis comprises a sidewall defining a plurality of vents facing the fan and allowing airflow generated by fan passing therethrough, and the fan is an axial fan, the axis of the fan being perpendicular to the sidewall.

17. The combination as claimed in claim 16, wherein the bracket comprises a box-shaped base and a pair of arms extending from the base, the rotating device being disposed in the base, the arms being secured to the sidewall.

18. The combination as claimed in claim 17, wherein the control circuit is provided by a circuit board installed in the base.

19. The combination as claimed in claim 18, wherein the control circuit comprises a periodic signal generating circuit for generating a periodic signal, and a rotating control circuit for receiving the periodic signal and controlling rotation of the shaft of the electromotor.

* * * * *